SEMICONDUCTOR PACKAGE

Filed Dec. 3, 1963 3 Sheets-Sheet 1

INVENTOR
C. E. GOLIGHTLY
BY
Rodnick B. Anderson
ATTORNEY

Sept. 19, 1967 C. E. GOLIGHTLY 3,343,107

SEMICONDUCTOR PACKAGE

Filed Dec. 3, 1963 3 Sheets-Sheet 2

Sept. 19, 1967 C. E. GOLIGHTLY 3,343,107

SEMICONDUCTOR PACKAGE

Filed Dec. 3, 1963 3 Sheets-Sheet 3

United States Patent Office 3,343,107

Patented Sept. 19, 1967

3,343,107
SEMICONDUCTOR PACKAGE

Charles E. Golightly, Hillside, N.J., assignor to Bell Telephone Laboratories, Incorporated, New York, N.Y., a corporation of New York

Filed Dec. 3, 1963, Ser. No. 327,767
7 Claims. (Cl. 333—84)

This invention relates to semiconductor packaging structures.

One of the major areas of activity in the communcations industry in recent years has been the adaptation of known electronic techniques to high microwave frequency communications systems. One of the primary objectives of the design of any such system is the full employment of electromagnetic wave transmisison mediums wherever possible because of the high resistive and inductive losses inherent in high frequency transmission by conventional conductors. Hence, techniques are continually being sought for inserting electronic components directly into such transmission mediums as waveguides, coaxial cables, and strip lines. One recent advance is a technique for incorporating a semiconductor diode into a balanced strip transmission line, as described in the application of M. V. Schneider, Ser. No. 281,270, filed May 17, 1963, which issued as U.S. Patent 3,209,291 Sept. 28, 1965.

A balanced strip transmisison line comprises two flat outer "ground" conductors on opposite sides of a flat central conductor. The Schneider application shows that a diode will effectively conduct strip line wave energy if one of its terminals is connected to the central conductor and the other is symmetrically connected to the two outer conductors. This type of connection is an improvement over a simple ground to central conductor connection in that it avoids local excitation of higher frequency transmission modes in the line and it reduces the series inductance of the device to give it a much higher frequency response.

Although conventional diodes are limited to passive functions such as rectifying and clipping, one advanced form, called the Esaki or tunnel diode, can be manipulated to display a negative-resistance characteristic which enables it to be used as either an amplifier or a generator of high frequency microwaves. One refined tunnel diode embodiment, comprising a minute particle of tellurium and silver alloyed to form a junction with a wafer of gallium antimonide, is further capable of low-noise amplification at room temperature over a very high frequency range. In theory, the GaSb tunnel diode could be incorporated into a strip transmission line in accordance with the Schneider technique to give low-noise amplification of waves having a frequency in excess of 50 kilomegacycles per second. In practice, the technical fabrication problems involved are so formidable that its experimental use, much less its mass-produced commercial use, would appear to be an impossibility.

The trouble with low-noise GaSb tunnel diodes is that the junction between the tellurium-silver particle and the gallium-antimonide wafer must be etched away to a thickness of about .0003 inch to give the requisite negative-resistance characteristic at frequencies in the kilomegacycle range. This, of course, makes the diode extremely fragile. A very thin-weight lead must be bonded to the tellurium-silver particles and extend out through the diode encapsulation to make contact with another conductor. The encapsulating process invariably exerts pressures on the lead which tend to break the diode at its delicate junction. It has been found that even if these pressures are reduced to avoid cracking of the junction, even the slightest mechanical forces transmitted to the diode can radically alter its current-voltage characteristic. Even if the device is successfully packaged, the thin, delicate lead to the diode has such high resistance and inductance that it seriously limits the frequency response of the packaged diode.

Use with a strip line in accordance with the Schneider technique requires that the diode be mounted in an aperture in the flat central conductor. Such mounting must be firm and stable, especially if a fragile GaSb diode is used. According to the Schneider application the diode preferably is encapsulated in a dielectric epoxy which cements it into the central conductor aperture. This also presents rather complicated fabricating problems because of the relative inaccessibility of the central conductor and the difficulty of maintaining uniform mechanical support when a number of diodes are so mounted. The encapsulating process must also insure a good contact between the diode lead and the central conductor which is particularly difficult when a delicate GaSb diode is being used because of its pressure sensitivity.

It is an object of this invention to provide a sturdy package structure for a GaSb diode.

It is another object of this invention to reduce or eliminate stresses on a GaSb diode during its encapsulation and utilization.

It is another object of this invention to increase the frequency response of a GaSb diode.

It is another object of this invention to facilitate the mass production of packaged GaSb diodes.

It is another object of this invention to facilitate the incorporation of semiconductor diodes into balanced strip transmission lines.

It is another object of this invention to facilitate the mass production of balanced strip transmission lines having incorporated therein gallium antimonide semiconductor tunnel diodes.

These and other objects of the invention are attained in an illustrative embodiment thereof comprising a hollow conductive mounting cylinder having part of its outer surface cut away to form a flat mounting platform for supporting a gallium antimonide semiconductor diode. Two stand-off insulators having conductive strips bonded to their upper surfaces are also mounted on the platform on opposite sides of the diode. The diode comprises a tiny pellet of tellurium and silver which is alloyed to a gallium antimonide wafer. A fine delicate lead from the pellet of the diode is bonded to the conductive surfaces of both insulators. A thin ribbon-shaped conductor is then mounted on edge on the upper conductive surfaces of the two stand-off insulators. Next, the diode is immersed in an appropriate solution which etches away the junction of the pellet and wafer to give the diode its desired electrical characteristics. One advantage of this structure is that it does not have any walls for containing the etchant during the etching process. Hence, the etchant can be applied in a continuous flow, and when the desired degree of etching is reached, the flow can be terminated and all of the etchant can be quickly and easily cleaned from the diode and surrounding structure.

A sturdy diode encapsulation is provided by two dielectric annuli, each of which has an axial length equal to half the axial length of the mounting cylinder. The two annuli have inner diameters which are equal to the outer diameter of the mounting cylinder, and are fitted over the mounting cylinder to surround it completely. The ribbon conductor extends out from the stand-off insulators at the mid-point of the mounting cylinder and is contained between the two dielectric annuli. The two annuli and the mounting cylinder are clamped together by male and female connectors both of which extend through the central aperture of the mounting cylinder. A conductive washer is imbedded in the second annulus and is pressed against the ribbon conductor to give electrical contact when the male and female connectors are firmly engaged. When thus assembled, this structure constitutes a solid semiconductor package which can absorb a considerable degree of shock and stress without affecting the delicate diode contained within it. Electrical contact with the gallium antimonide terminal of the diode can be made by merely contacting either of the conductive male or female connectors, while electrical contact with the tellurium-silver terminal can be made by contacting any point on the periphery of the washer. The forces exerted on the ribbon conductor by the first dielectric annulus and the conductive washer are not transmitted to the diode, but rather are absorbed by the stand-off insulators to which the ribbon conductor is bonded. Hence, the package can be clamped or screwed together very tightly to assure solid electrical contact and tight encapsulation without interfering with any of the electrical characteristics of the diode.

The semiconductor package can be adapted for insertion into a balanced strip transmission line by making the outer diameter of the second annulus larger than the outer diameter of the first annulus. A first aperture is then drilled through the central conductor and the strip line dielectric to a first ground conductor. A second aperture is drilled through the second ground conductor and the separating dielectric to the central conductor. The first aperture has a diameter equal to the outer diameter of the first dielectric annulus and the second aperture has a diameter equal to the outer diameter of the second dielectric annulus, thereby permitting the package to be snugly fitted into the strip line. After insertion, a cover plate is fitted over the package which firmly presses the package into the precut apertures. When this is done, one of the package connectors is firmly pressed against the first outer strip line conductor, the ribbon conductor and washer of the package are firmly pressed against the central strip line conductor, and the other connector is short-circuited to make electrical connection with the second outer conductor. Hence, solid electrical contact is made in accordance with the Schneider strip line mounting technique.

These and other objects and features of my invention will be more fully understood from a consideration of the following detailed description taken in conjunction with the accompanying drawing in which.

Figure 1:
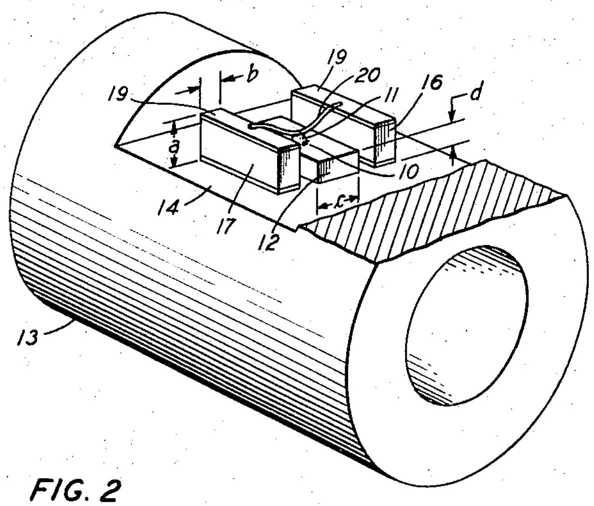
FIG. 1 is a perspective view of part of a semiconductor diode package in accordance with the invention.

Referring now to FIG. 1 there is shown a partially finished semiconductor tunnel diode 10 comprising a pellet 11 of tellurium and silver which is bonded to a wafer 12 of zinc doped gallium antimonide. The diode is mounted on a hollow conductive mounting cylinder 13 part of the outer surface of which is cut away to form a mounting platform 14. Located on the mounting platform on opposite sides of the diode are a pair of stand-off insulators 16 and 17. The stand-off insulators may typically be made of quartz, and have upper surfaces which are covered with conductive strips 19. Strips 19 may advantageously be made of gold and be bonded onto the quartz insulators through an intermediate layer of titanium in a manner known in the art. The insulators may be bonded to the mounting platform by including intermediate layers of titanium and gold between the insulators and the platform. A thin conductive lead 20 is then bonded, as by soldering, to the pellet and the two conductive surfaces 19. As will become clear later, mounting of the diode in this manner facilitates its final processing and permits it to be easily encapsulated for insertion into a balanced strip transmission line.

The dimensions of the elements shown in FIG. 1 are all very small, typical examples being as follows:

| | | |
|---|---|---|
| Diameter of pellet **11** | mils | 3 |
| Height A of the insulators | do | 10 |
| Width B of the insulators | do | 10 |
| Width C of the wafer | do | 15 |
| Height D of the wafer | do | 8 |
| Diameter of the lead **20** | do | 2 |
| Outer diameter of cylinder **13** | inch | .125 |
| Axial length of the cylinder **13** | do | .123 |

Figure 2:
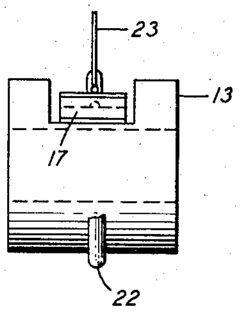
FIG. 2 is a side view of part of a semiconductor diode package.
Figure 3:
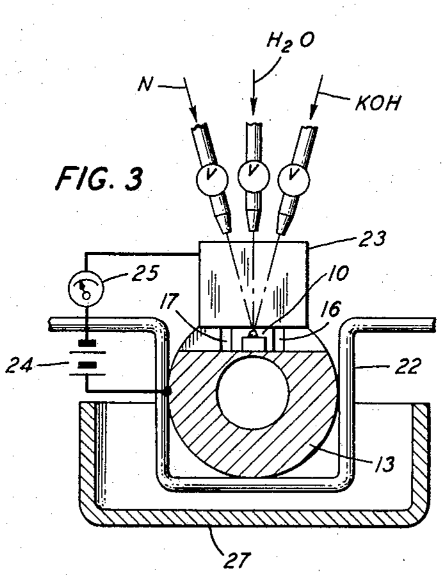
FIG. 3 is a front sectional view of part of a semiconductor diode package illustrating a method for etching the diode.
Figure 4:
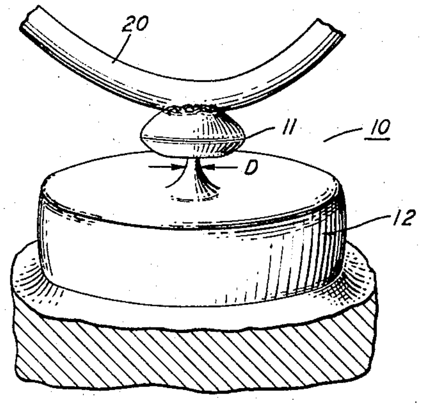
FIG. 4 is a perspective view of part of a semiconductor diode.

The second step of the diode package assembly is illustrated in FIGS. 2 and 3 wherein the mounting cylinder 13 is mounted within a holder wire 22. A ribbon conductor 23, which may be made of gold foil, is then mounted on edge on the two conductive surfaces 19 of the stand-off insulators 16 and 17. The next step is to etch the diode as shown in FIG. 3 to obtain the desired negative-resistance characteristic. This is done by directing a jet of a suitable liquid etchant such as potassium hydroxide solution directly at the junction of the pellet with the wafer. Electrical current is simultaneously directed through the junction by means of a battery 24. An ammeter 25 gives an indication of when the proper diode resistance is reached at which time the etchant is immediately shut off and a jet of water is directed at the junction for cleaning purposes. After a short period of time, a jet of gaseous dry nitrogen is directed at the junction which evaporates the water. The etchant and water are permitted to run freely from the mounting platform into a container 27. When the diode is constructed for amplification of electromagnetic waves having frequencies of 5 kilomegacycles per second, the etching process reduces the diameter of the junction to approximately .0003 inch. This extremely small junction diameter D is illustrated in FIG. 4, which is a sketch made from a photograph of a diode of the type described.

Gallium antimonide tunnel diodes are normally made by an etching process. The mounting structure shown on FIG. 3, however, is advantageous because it does not have any retaining side walls, thereby permitting the etchant to be applied as a continuous flowing stream which is readily drained off. Application in this manner makes the etching process more controllable and makes the subsequent cleaning process easier and more reliable. The quartz insulators are impervious to the etchant, while the conductors including the mounting cylinder may be made of, or coated with, gold to withstand the exposure to potassium hydroxide.

Figure 5:
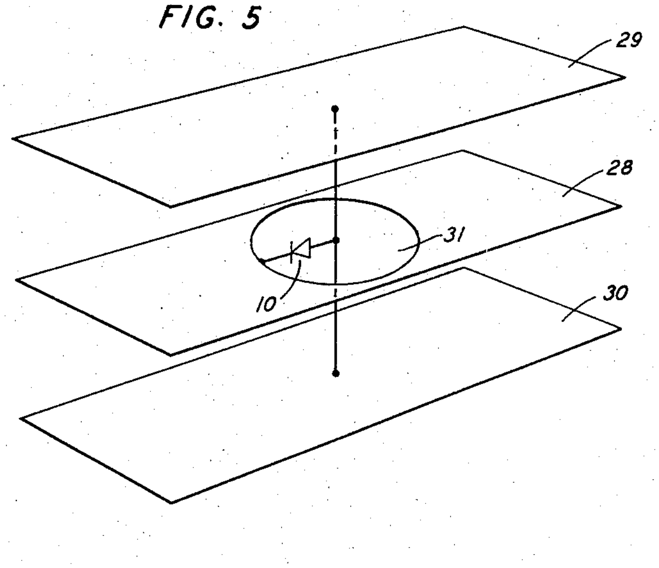
FIG. 5 is a schematic illustration of a technique for mounting a diode in a balanced strip transmission line.

FIG. 5 schematically illustrates the incorporation of a diode into a balanced strip line in accordance with the aforementioned Schneider technique. The strip line comprises a central conductor 28, a first outer ground conductor 29, and a second outer ground conductor 30. The diode 10 is mounted in an aperture 31 in the central conductor with one terminal being symmetrically connected by conductors of substantially equal length to outer conductors 29 and 30, the other terminal being connected to central conductor 28. With this arrangement strip line current is conducted through the diode with a minimum of losses due to spurious inductances and mode excitation. The central conductor is normally separated from the two outer conductors by dielectric slabs which are not shown. It is quite clear that a considerable amount of innovation would be required to incorporate, on a mass-production basis, delicate gallium antimonide diodes as shown in FIG. 4 into balanced strip lines as shown in FIG. 5. The assembled structure must be sturdy enough to withstand the abuses of normal handling, while the delicate junction of the diode is so sensitive that the slightest pressures will alter its electrical characteristics, or break it completely. Moreover, securing diode 10 in aperture 31 by epoxy or some other cement, as is presently done, is a relatively inefficient process, if done on a mass-production basis. Also, the epoxy, in drying, exerts a force strong enough to alter the characteristics of the diode.

Figure 6:
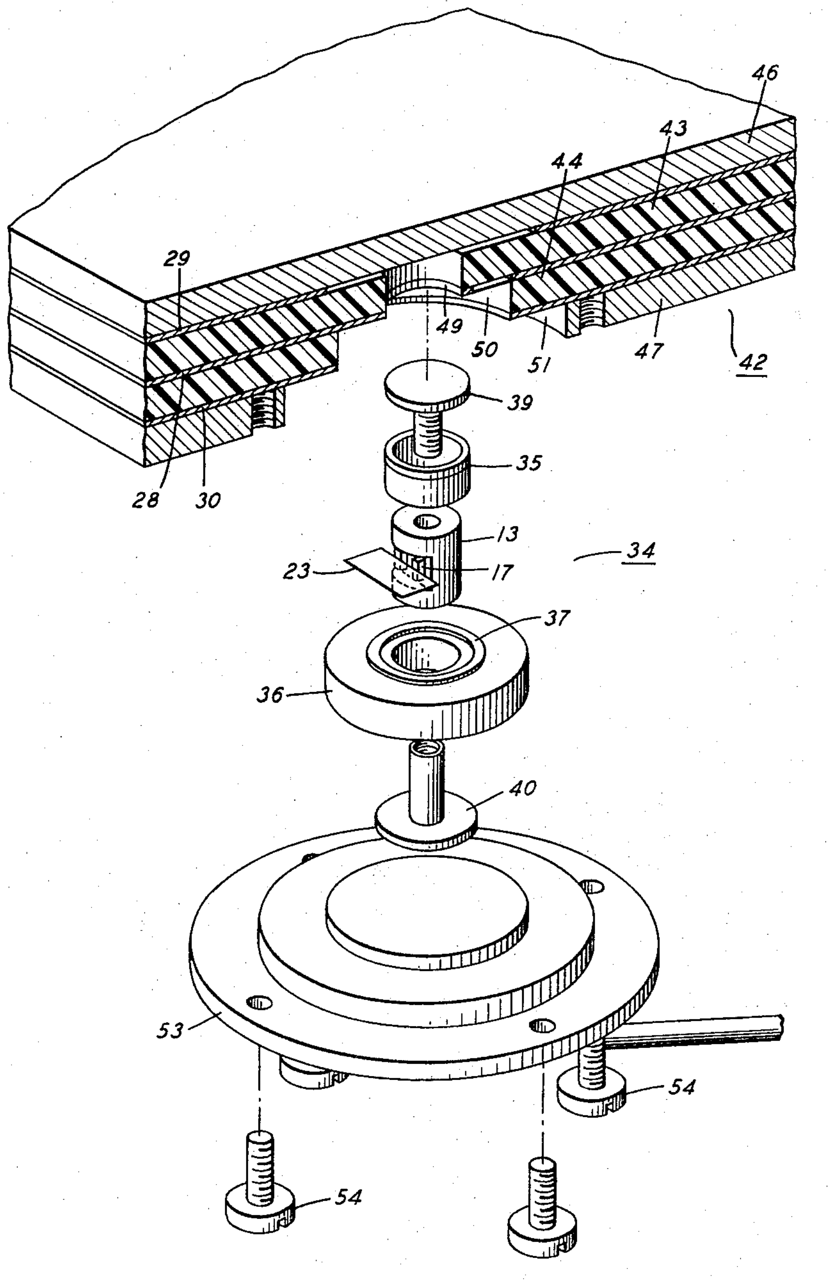
FIG. 6 is an exploded view of a semiconductor diode package assembly and a portion of a balanced strip line in accordance with the invention.

By mounting the diode in accordance with the invention as part of a particular package assembly 34, shown on FIG. 6, these problems are avoided. Assembly 34 comprises the mounting cylinder 13 of FIGS. 2 and 3, a first dielectric annulus 35 and a second dielectric annulus 36. Annuli 35 and 36 have an inner diameter equal to the outer diameter of mounting cylinder 13 and have axial lengths which are each equal to half the axial length of the mounting cylinder. They are arranged to fit over the mounting cylinder and secure the ribbon lead 23 tightly between them. Imbedded in annulus 36 is a conductive washer 34 which makes contact with ribbon conductor 23 when it is fitted over the mounting cylinder. The two annuli and the mounting cylinder are securely clamped together by male and female connectors 39 and 40 which are shown as being threaded, though other forms of connection could be used. Female connector 40 has an outer diameter equal to the inner diameter of the mounting cylinder 13 so that, when the two connectors are screwed together effective contact is made with the diode by way of the conductive mounting cylinder 13. It should be noted that assembly 34 constitutes a solid, sturdy package for the semiconductor diode which could have independent utility apart from the strip transmission line.

Figure 7:
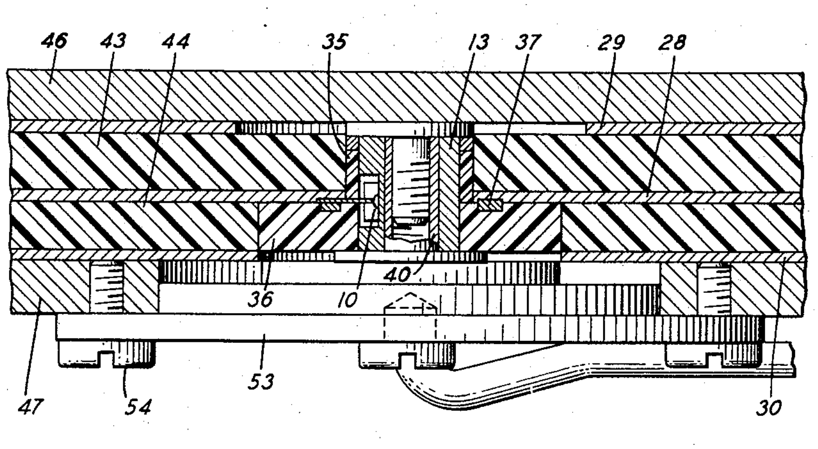
FIG. 7 is a sectional view of a semiconductor diode package mounted in a balanced strip transmission line in accordance with the invention.

Package assembly 34 is adapted to be easily inserted into balanced strip transmission line 42 which comprises a central conductor 28, outer conductors 29 and 30, and dielectric slabs 43 and 44. Outer metallic plates 46 and 47 give the strip line mechanical strength and rigidity. Concentric apertures 49, 50 and 51 are cut into the transmission line to receive the diode package assembly. Apertures 49 and 50 have the same outer diameters as dielectric annuli 35 and 36, respectively, while slabs 43 and 44 have the same thickness as the axial lengths of annuli 35 and 36, thereby permitting the assembly to be inserted into the strip line as shown in FIG. 7. A conductive cover plate 53 is attached to outer plate 47 by bolts 54 to force the semiconductor package assembly into the strip line. When the bolts are tightened, ribbon conductor 23 is firmly engaged between washer 37 and central conductor 28, while the male connector 39 is forced into firm contact with the outer strip line conductor 29. The cover plate 53 also electrically connects the female connector 40 with the outer conductor 30. With firm engagement as shown in FIG. 7, one terminal of the diode is firmly connected with the central connector 28 while the other terminal is connected to both of the outer strip line conductors as required by the Schneider technique to give the most favorable diode response.

It can be appreciated that the ribbon diode conductor 23 can be tightly clamped between the two dielectric annuli and against the central conductor 28 without affecting the severely pressure sensitive diode 10. This is largely due to the provision of the stand-off insulators and their conductive top surfaces. All of the mechanical stresses that are applied to the ribbon conductor are absorbed by the insulators rather than being transmitted to the delicate diode. The large surface areas of the ribbon conductor and washer 37 greatly minimize the resistive and inductive losses of the high frequency energy transmitted by them. The delicate lead 20 of FIG. 1 which is actually in contact with the diode unavoidably introduces loss, but its actual length is so small that the loss it causes is negligible.

A review of the entire assembly process shows that it requires very little manual dexterity and is readily amenable to mass-production techniques. The leads 20 are bonded to pellet 11 before it has been etched and rendered sensitive. The etching process itself is easily controllable and can be reliably cleaned because none of the etchant is permitted to accumulate on the device. It is, of course, not necessary to remount the fragile diode after it has been etched. Package assembly 34 provides a sturdy encapsulation for the diode which insures reliable contact with its terminals. Any balanced strip transmission line is easily adapted to receive a package of corresponding size by merely drilling the three concentric apertures 49, 50, and 51. When the diode is inserted there are no problems of access and no cementing or other procedures are required which may tend toward non-uniformities.

The embodiment which has been shown is intended to be merely illustrative of my various inventive concepts. Numerous other embodiments and modifications may be made without departing from the spirit and scope of the invention. In particular, various other semiconductors can be used to make the semiconductive element.

What is claimed is:

1. A semiconductive device comprising:

a semiconductor element;

a first conductor electrically connected to one side of the element;

a second conductor electrically connected to another side of the element;

said first conductor comprising a mounting platform for supporting the element;

a third conductor;

means for mechanically forcing the second conductor into electrical contact with the third conductor, whereby the second conductor is subjected to mechanical stresses;

and means for absorbing said mechanical stresses and preventing them from being mechanically transmitted to said element comprising two stand-off insulators;

said insulators being mounted on the mounting platform on opposite sides of the element;

said second conductor being mechanically bonded to both of said insulators.

2. The device of claim 1 wherein:

the bottom surface of each of the insulators is bonded to the mounting platform;

a conductive strip is bonded to a top surface of each of the insulators;

the second conductor is bonded to the conductive strips;

and a fourth conductor is bonded to the element and to both of the conductor strips of the two insulators;

said second conductor having a much larger surface area per unit length than the fourth conductor, whereby the radio-frequency resistance and inductance per unit of length of the second conductor is much smaller than that of the fourth conductor.

3. In combination:

a balanced strip transmission line having a planar central conductor, a first planar outer conductor, and a second planar outer conductor;

the central conductor and the first outer conductor being separated by a first dielectric slab;

the central conductor and the second outer conductor being separated by a second dielectric slab;

a hollow conductive mounting cylinder;

part of the outer surface of the mounting cylinder being cut away to form a planar mounting platform;

a semiconductor diode mounted on the platform;

a pair of stand-off insulators, each having an upper conductive surface, mounted on the platform on opposite sides of the diode;

a ribbon conductor mounted on the upper conductive surfaces;

a lead interconnecting the diode with the upper conductive surfaces of the two insulators;

a first dielectric annulus having an axial length substantially equal to the width of the first dielectric slab;

a second dielectric annulus having an axial length substantially equal to the width of the second dielectric slab;

the first annulus surrounding substantially half of the mounting cylinder;

the second annulus surrounding substantially the other half of the mounting cylinder;

the ribbon conductor extending between the first and second annuli;

means for clamping together the first and second annuli and the mounting cylinder and for conductively interconnecting the diode with the first and second outer conductors comprising male and female connectors both of which extend through the central apertures of the first and second annuli and the conductive mounting cylinder;

and means for mechanically forcing the ribbon conductor against the central conductor, for mechanically forcing one of the connectors against the first outer conductor, and for conductively connecting the other connector with the second outer conductor comprising a cover plate which is in contact with one of the connectors and with the second outer conductor.

4. A semiconductor package comprising:

a hollow conductive mounting cylinder;

part of the outer surface of the mounting cylinder being cut away to form a planar mounting platform;

a semiconductor diode mounted on the platform;

a pair of stand-off insulators, each having one conductive surface, mounted on the platform on opposite sides of the diode;

a first conductor having a relatively large surface area mounted on the conductive surfaces;

a lead having a relatively small surface area interconnecting the diode with the conductive surfaces of the two insulators;

a first dielectric annulus having an axial length substantially equal to half the axial length of the mounting cylinder;

a second dielectric annulus having an axial length substantially equal to half the axial length of the mounting cylinder;

the first annulus surrounding substantially half of the mounting cylinder;

the second annulus surrounding substantially the other half of the mounting cylinder;

the first conductor extending between the first and second annuli;

and means for clamping together the first and second annuli and the mounting cylinder comprising male and female connectors both of which extend through the central apertures of the first and second annuli and the conductive mounting cylinder.

5. A semiconductor package comprising:

a wafer of gallium antimonide;

a pellet of tellurium and silver alloy bonded to the gallium antimonide wafer;

the junction of contact between the pellet and the wafer having a diameter of approximately .0004 inch;

a first conductor electrically connected to the wafer;

a second conductor electrically connected to the pellet;

said first conductor comprising a mounting platform for supporting the wafer;

a third conductor;

means for mechanically forcing the second conductor into electrical contact with the third conductor, whereby the second conductor is subjected to mechanical stresses;

means for absorbing said mechanical stresses and preventing them from being mechanically transmitted to said junction comprising two stand-off insulators, each bonded to the mounting platform on opposite sides of the wafer;

said second conductor being mechanically bonded to both of said insulators;

and a fourth conductor bonded to the pellet and to both of the insulators and being electrically connected to the second conductor;

said fourth conductor having a much smaller weight per unit length and surface area per unit length than the second conductor.

6. The semiconductor package structure of claim 5 wherein:

the first conductor comprises a hollow cylinder part of the outer surface of which is cut away to form the mounting platform;

the second conductor is ribbon-shaped and is mounted on edge on the two stand-off insulators;

and further comprising:

a first dielectric annulus;

a second dielectric annulus;

both annuli having an axial length substantially equal to half the axial length of the conductive cylinder and an inner diameter substantially equal to the outer diameter of the conductive cylinder;

the first annulus substantially surrounding a first half of the conductive cylinder;

the second annulus substantially surrounding a second half of the mounting cylinder;

the second conductor extending between the first and second annuli;

and means for clamping together the first and second annuli and the mounting cylinder comprising male and female conductive connectors, both of which extend through the central apertures of the first and second annuli and the conductive mounting cylinder.

7. The semiconductive packaging structure of claim 6 further comprising:

a balanced strip transmission line having a planar central conductor, a first planar outer conductor, and a second planar outer conductor;

the central conductor and the first outer conductor being separated by a first dielectric slab;

the central conductor and the second outer conductor being separated by a second dielectric slab;

both of the dielectric slabs having a width substantially equal to half the axial length of the conductive cylinder;

an aperture in the central conductor and the first dielectric slab substantially equal to the outer diameter of the first dielectric annulus;

an aperture in the second outer conductor and the second dielectric slab substantially equal to the outer diameter of the second dielectric annulus;

the conductive cylinder being mounted within the apertures of the two dielectric slabs;

and a cover plate for mechanically forcing one of the connectors into electrical contact with the first outer conductor, for mechanically forcing the ribbon-shaped second conductor into electrical contact with the central conductor, and for conductably connecting the other connector with the second outer conductor.

References Cited

UNITED STATES PATENTS

| | | | |
|---|---|---|---|
| 2,977,484 | 3/1961 | Sterzer | 317—101 |
| 3,063,023 | 11/1962 | Dacey et al. | 317—235 |
| 3,105,922 | 10/1963 | Fukui et al. | 317—234 |
| 3,140,452 | 7/1964 | Schmitz | 317—235 |
| 3,241,011 | 3/1966 | De Mille et al. | 317—234 |
| 3,308,355 | 3/1967 | Davis et al. | 317—236 |

HERMAN KARL SAALBACH, *Primary Examiner.*

C. BARAFF, *Assistant Examiner.*